(12) United States Patent
Simonelli et al.

(10) Patent No.: US 7,833,883 B2
(45) Date of Patent: Nov. 16, 2010

(54) PRECURSOR GAS MIXTURE FOR DEPOSITING AN EPITAXIAL CARBON-DOPED SILICON FILM

(75) Inventors: Danielle M. Simonelli, Beaverton, OR (US); Anand S. Murthy, Portland, OR (US); Daniel B. Aubertine, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 664 days.

(21) Appl. No.: 11/692,782

(22) Filed: Mar. 28, 2007

(65) Prior Publication Data
US 2008/0242061 A1 Oct. 2, 2008

(51) Int. Cl.
*H01L 21/20* (2006.01)
*H01L 21/36* (2006.01)

(52) U.S. Cl. ............................... 438/478; 257/E21.131
(58) Field of Classification Search ............ 257/E21.43, 257/E21.131; 438/478
See application file for complete search history.

(56) References Cited

U.S. PATENT DOCUMENTS

| | | | |
|---|---|---|---|
| 6,346,732 B1 * | 2/2002 | Mizushima et al. | 257/382 |
| 6,960,781 B2 | 11/2005 | Currie et al. | |
| 7,521,365 B2 * | 4/2009 | Kim et al. | 438/694 |
| 2006/0131665 A1 | 6/2006 | Murthy | |
| 2006/0134872 A1 | 6/2006 | Hattendorf | |
| 2006/0148151 A1 * | 7/2006 | Murthy et al. | 438/197 |
| 2006/0166414 A1 * | 7/2006 | Carlson et al. | 438/149 |
| 2006/0234504 A1 * | 10/2006 | Bauer et al. | 438/674 |
| 2007/0281411 A1 * | 12/2007 | Murthy et al. | 438/197 |
| 2007/0284613 A1 * | 12/2007 | Chui et al. | 257/192 |
| 2007/0287272 A1 * | 12/2007 | Bauer et al. | 438/485 |
| 2008/0138955 A1 * | 6/2008 | Ye et al. | 438/300 |
| 2008/0142785 A1 * | 6/2008 | Datta et al. | 257/19 |
| 2008/0153237 A1 * | 6/2008 | Rachmady et al. | 438/300 |

OTHER PUBLICATIONS

U.S. Appl. No. 10/993,865, filed Nov. 18, 2004, Murthy.
U.S. Appl. No. 11/386,518, filed Mar. 21, 2006, Liu.
U.S. Appl. No. 11/387,012, filed Mar. 21, 2006, Rachmady.
U.S. Appl. No. 11/521,850, filed Sep. 14, 2006, Murthy et al.

* cited by examiner

*Primary Examiner*—W. David Coleman
*Assistant Examiner*—Latanya Crawford
(74) *Attorney, Agent, or Firm*—Blakely, Sokoloff, Taylor & Zafman LLP

(57) ABSTRACT

A precursor gas mixture for depositing an epitaxial carbon-doped silicon film is described. The precursor gas mixture is comprised of a volume of a silicon precursor gas, a volume of acetylene gas and a volume of a carrier gas. A method of forming a semiconductor structure having an epitaxial carbon-doped silicon film is also described. In the method, a substrate having a high polarity dielectric region and a low polarity crystalline region is provided. A precursor gas is flowed to provide a silyl surface above the high polarity dielectric region and a carbon-doped silicon layer above the low polarity crystalline region. The silyl surface is then removed from above the high polarity dielectric region. The flowing and removing steps are repeated to provide a carbon-doped silicon film of a desired thickness above the low polarity crystalline region.

12 Claims, 15 Drawing Sheets

FIG. 3A
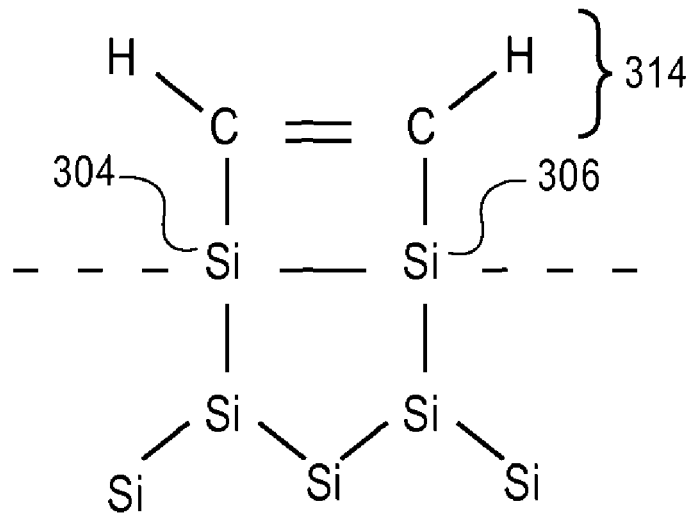
FIG. 3B
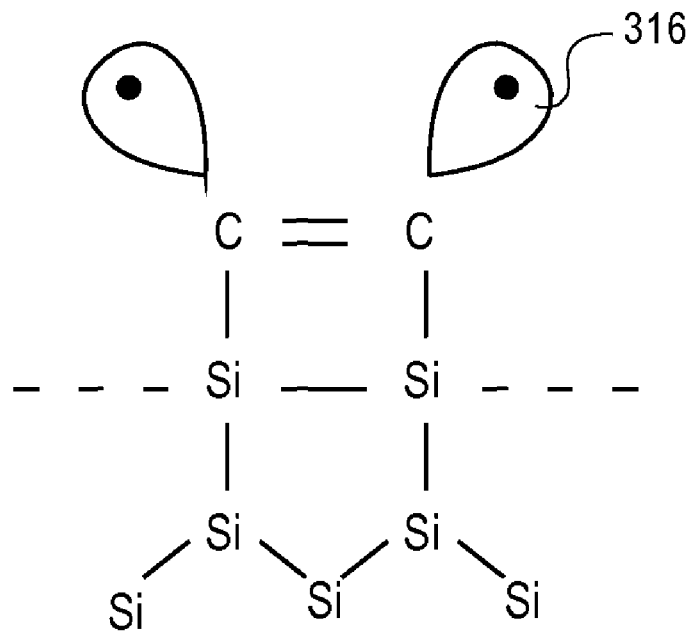
FIG. 3C

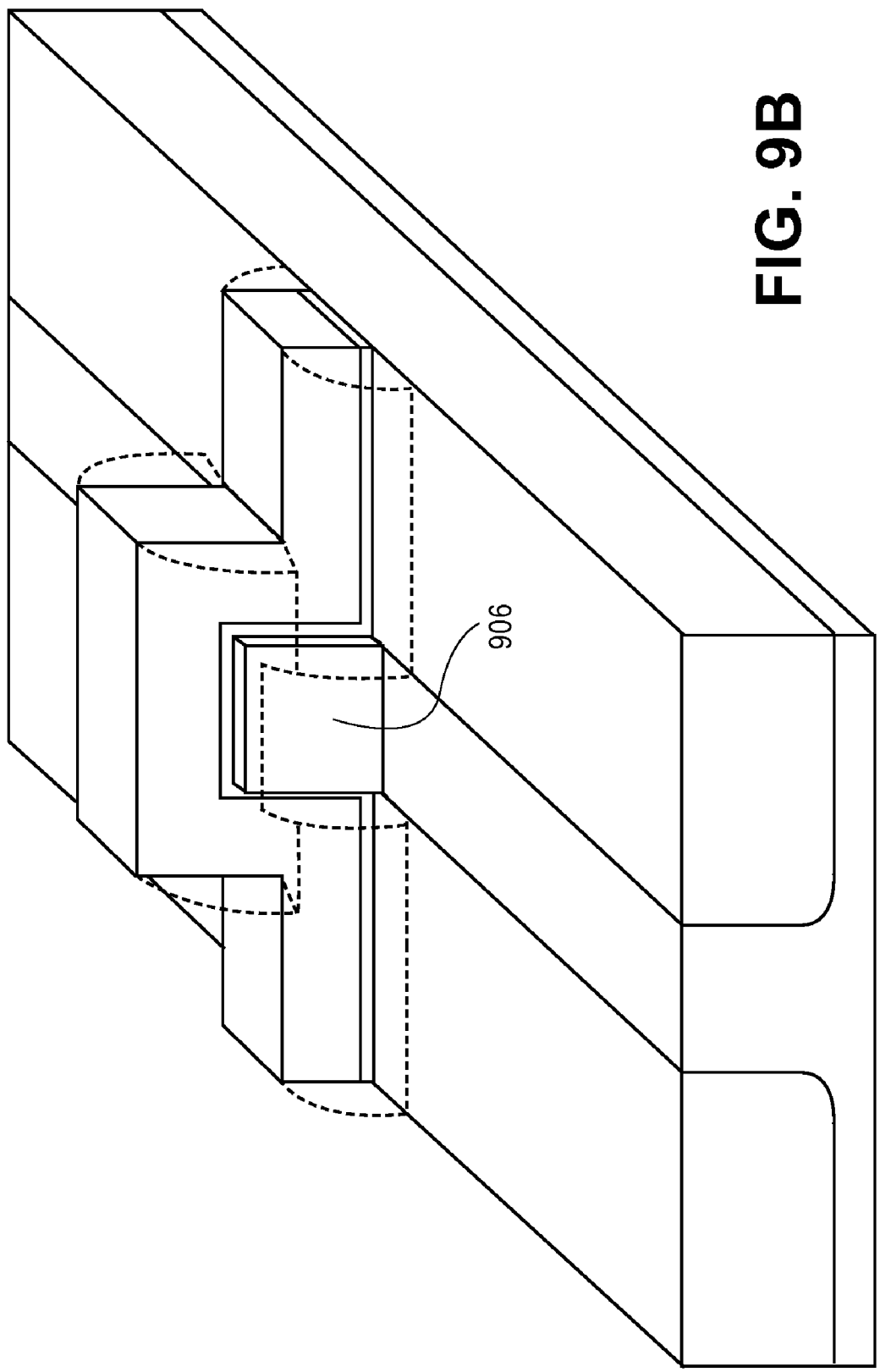

US 7,833,883 B2

PRECURSOR GAS MIXTURE FOR DEPOSITING AN EPITAXIAL CARBON-DOPED SILICON FILM

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

FIG. 1 depicts a typical strained PMOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. Strain-inducing source/drain regions are comprised of a material with a larger lattice constant than that of the channel region 106. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can invoke a uniaxial compressive strain on the channel region 106. Such a compressive strain in the channel region 106 can enhance the hole mobility in the channel region 106 of PMOS-FET 100, lending to improved performance of the device.

FIGS. 2A-C illustrate a typical process flow for forming strain-inducing source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206.

Referring to FIG. 2B, portions of substrate 202, including source/drain regions 214, are removed, e.g. by an etch process, to form recessed regions 216 in substrate 202. Subsequently, strain-inducing source/drain regions 220 are formed by selectively growing an epitaxial film into recessed regions 216, as depicted in FIG. 2C. Strain-inducing source/drain regions 220 can be doped with charge-carrier atoms, e.g. boron in the case of a PMOS-FET, which may be carried out in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing source/drain regions 220 are comprised of a material with a larger lattice constant than that of channel region 206. Therefore, a uniaxial compressive strain, depicted by the arrows in FIG. 2C, is rendered on channel region 206 in PMOS-FET 230, which can enhance hole mobility in the device.

BRIEF DESCRIPTION OF THE DRAWINGS

FIGS. 3A-C illustrate the adsorption of an acetylene molecule onto a crystalline silicon surface, in accordance with an embodiment of the present invention.

FIGS. 9A-C illustrate cross-sectional views representing the formation of strain-inducing source/drain regions in a non-planar NMOS-FET, in accordance with an embodiment of the present invention.

DETAILED DESCRIPTION

Figure 1:
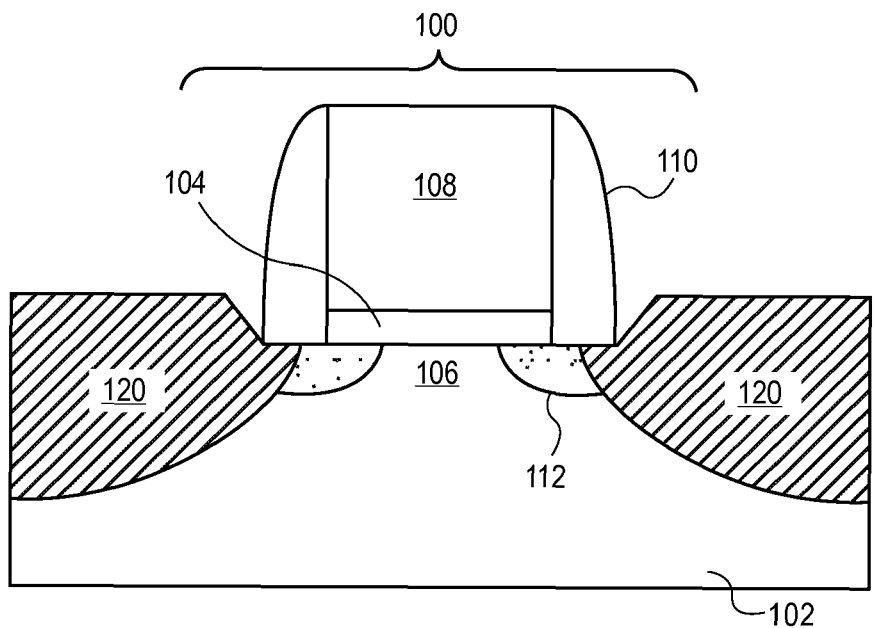
FIG. 1 illustrates a cross-sectional view of a strained P-type Metal Oxide Semiconductor Field-Effect Transistor (PMOS-FET), in accordance with the prior art.
Figure 2A:
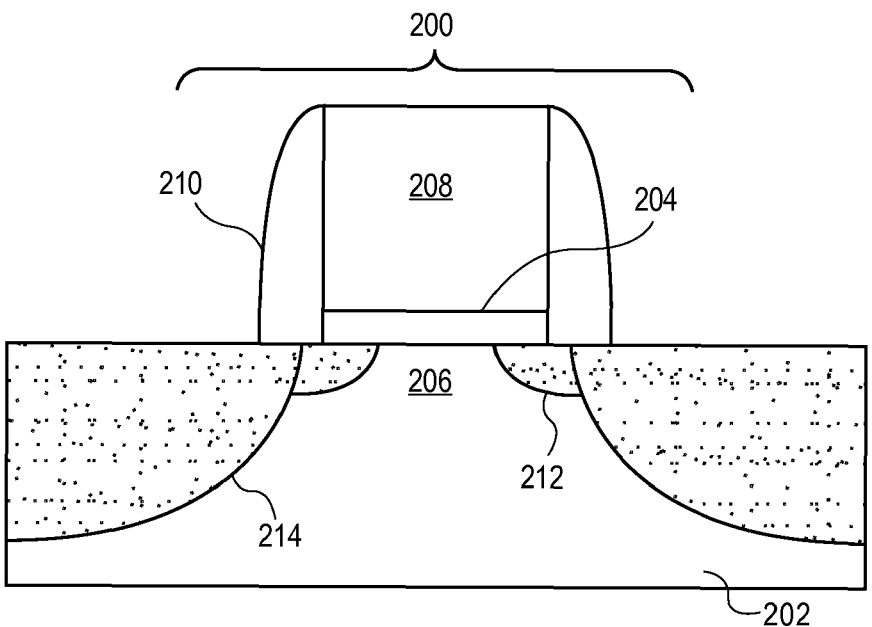
FIGS. 2A-C illustrate cross-sectional views representing the formation of a PMOS-FET with strain-inducing source/drain regions, in accordance with the prior art.
Figure 2B:
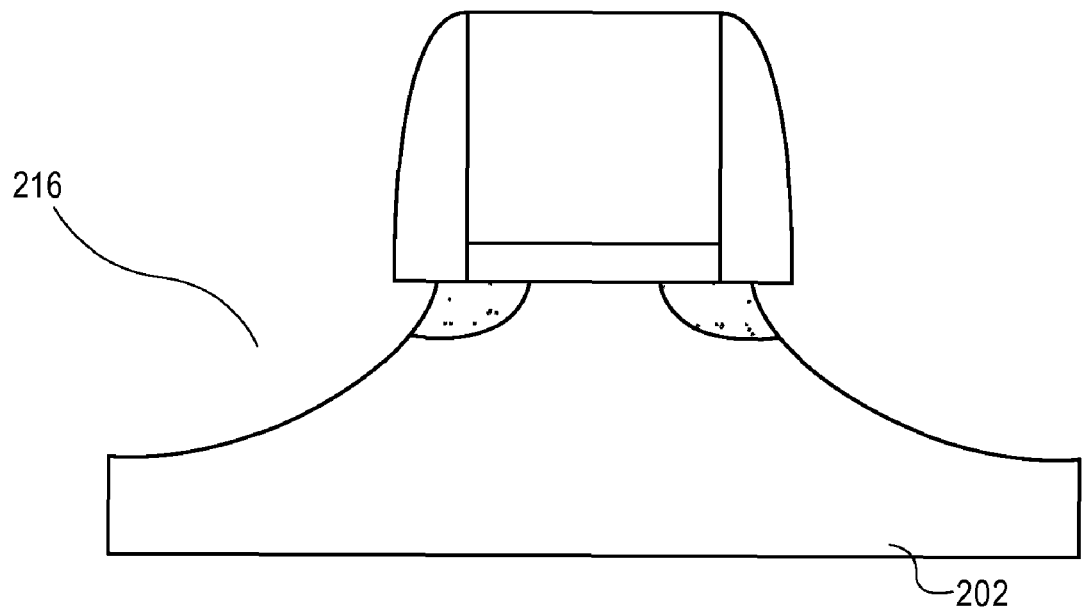
Figure 2C:
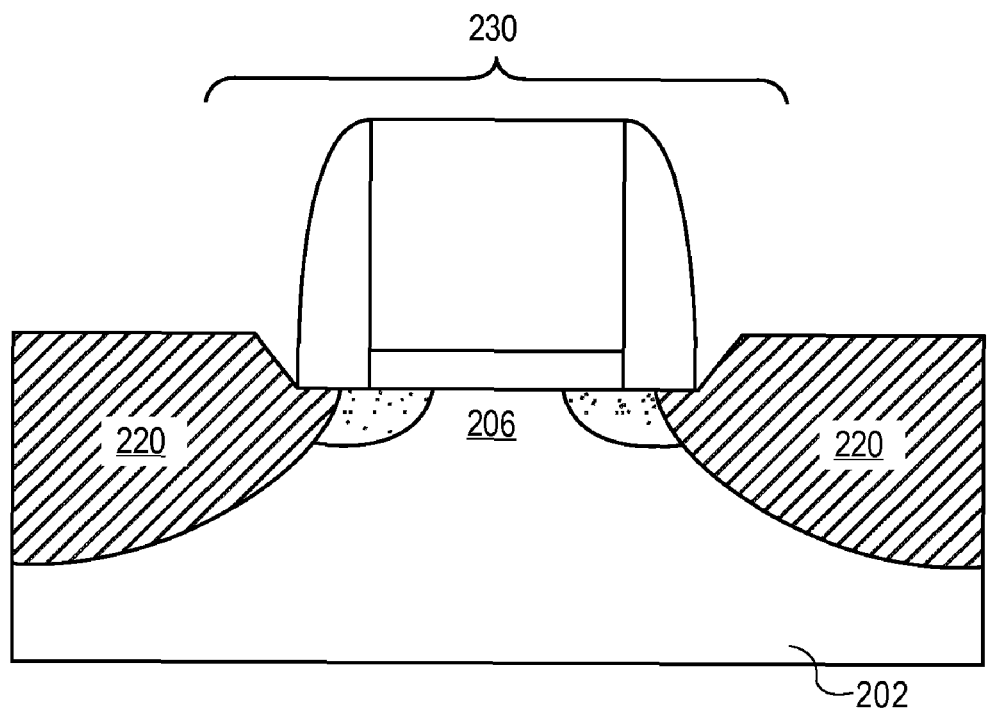

A method to fabricate epitaxial carbon-doped silicon source/drain regions for N-type Metal Oxide Semiconductor Field-Effect Transistors (NMOS-FETs) is described herein. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a precursor gas mixture for depositing an epitaxial carbon-doped silicon film. In one embodiment, the precursor gas mixture is comprised of a volume of a silicon precursor gas, a volume of acetylene gas and a volume of a carrier gas. Also disclosed herein is a method of forming a semiconductor structure having an epitaxial carbon-doped silicon film. A substrate having a high polarity dielectric region and a low polarity crystalline region may be provided. In one embodiment, a precursor gas is flowed to provide a silyl surface above the high polarity dielectric region and a carbon-doped silicon layer above the low polarity crystalline region. The silyl surface may then be removed from above the high polarity dielectric region. In one embodiment, the flowing and removing steps are repeated to provide a carbon-doped silicon film of a desired thickness above the low polarity crystalline region. An NMOS-FET with source/drain regions comprised of such an epitaxial carbon-doped silicon film and a crystalline silicon channel region may have an enhanced electron mobility in the channel region when the NMOS-FET is in an ON state.

The use of a precursor gas containing acetylene molecules to deposit an epitaxial carbon-doped silicon film may provide films having a high concentration of substitutional carbon atoms. For example, in accordance with an embodiment of the present invention, acetylene is employed as the source of carbon atoms in the formation of an epitaxial film of carbon-doped silicon on a crystalline silicon surface, wherein the carbon-doped silicon film has an atomic concentration of substitutional carbon atoms greater than 1.5% of the total composition of the epitaxial film. The selective formation of an epitaxial carbon-doped silicon film on a crystalline surface by using acetylene as the predominate carbon source may be carried out by applying a series of deposition/etch steps. That is, a non-selective deposition process may be made selective by iteratively removing portions of a deposited film from undesirable locations. In one embodiment, the etch steps are separate from the deposition steps. In another embodiment, the etch steps are carried out in situ, i.e. coincidentally with the deposition steps.

An acetylene molecule may react with so-called dangling bonds, i.e. unpaired valence electrons, present on the surface of a crystalline surface. FIG. 3 illustrates the adsorption of an acetylene molecule onto a crystalline silicon surface, in accordance with an embodiment of the present invention.

Referring to FIG. 3A, the two carbon atoms of an acetylene molecule 302 are attracted to two neighboring silicon atoms 304 and 306 from a crystalline silicon surface 312. In accordance with an embodiment of the present invention, the electron density of the carbon-carbon triple bond 308 is donated into the dangling bonds 310 of the electrophillic silicon atoms. The carbon atoms in gas-phase acetylene have sp orbital configuration and, hence, a region of high charge density which enables adsorption of the molecule onto the crystalline silicon surface.

Referring to FIG. 3B, the acetylene molecule 302 adsorbs to the crystalline silicon surface 312 to form a structure having an adsorbed acetylene molecule 314 on the two neighboring silicon atoms 304 and 306 from crystalline silicon surface 312. In accordance with an embodiment of the present invention, the carbon atoms of the adsorbed acetylene molecule 314 now have an $Sp^2$ orbital configuration, as indicated by the angled hydrogen atoms.

Referring to FIG. 3C, the adsorbed acetylene molecule 314 dehydrogenates to form active sites 316 where further deposition may take place. In accordance with an embodiment of the present invention, adsorbed acetylene molecule 314 is bound so tightly to the two neighboring silicon atoms 304 and 306 from crystalline silicon surface 312 that only desorption of the hydrogen atoms occurs. In one embodiment, the adsorbed carbon atoms having reactive sites 316 are subsequently incorporated into an epitaxial carbon-doped silicon film.

Figure 4:
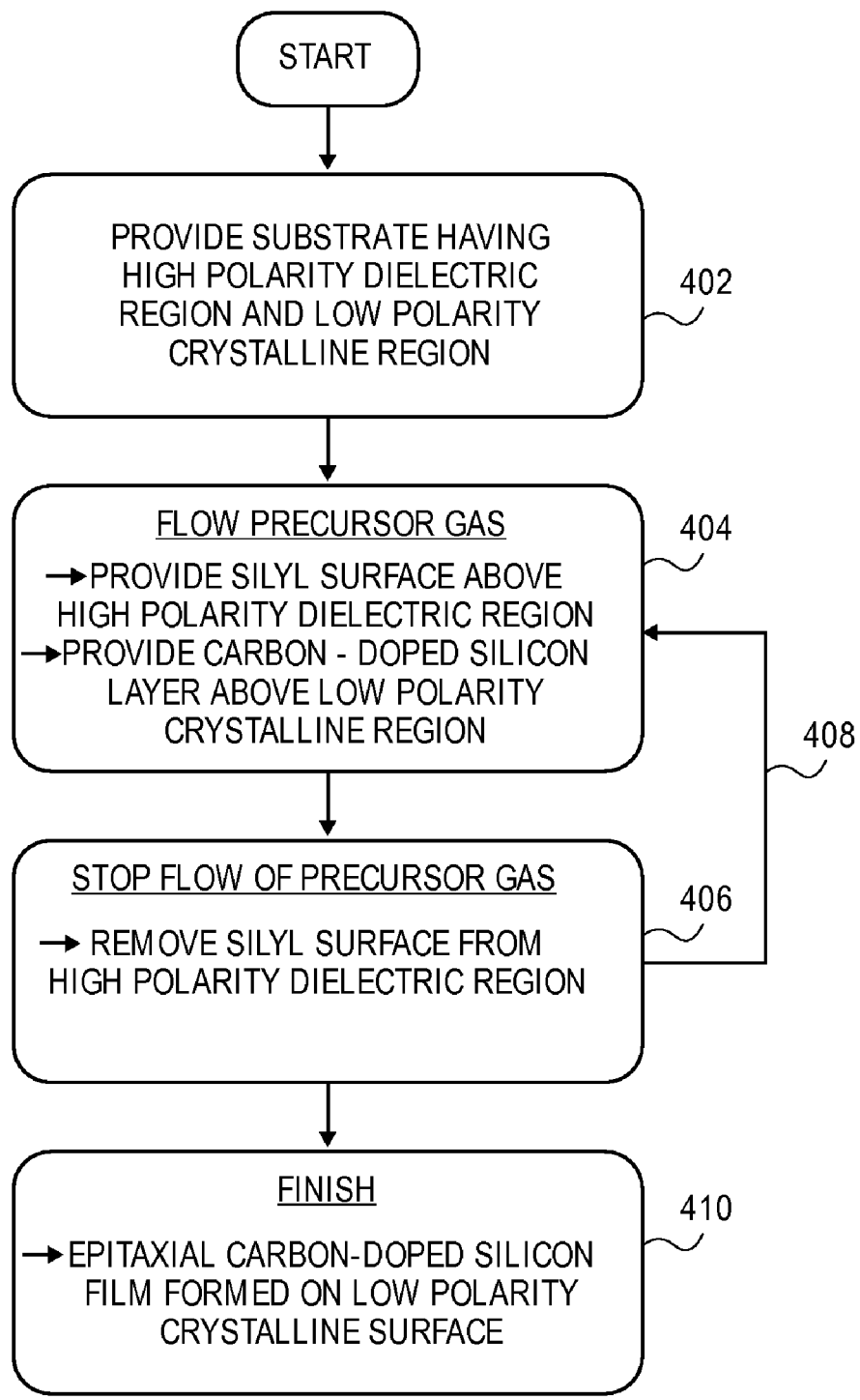
FIG. 4 is a flowchart representing the steps in the deposition process of an epitaxial carbon-doped silicon film, in accordance with an embodiment of the present invention.

A precursor gas comprised of acetylene molecules may be used to deposit an epitaxial carbon-doped silicon film. FIG. 4 is a flowchart representing the steps in the deposition process of an epitaxial carbon-doped silicon film, in accordance with an embodiment of the present invention.

Referring to step 402 of flowchart 400, a substrate having a high polarity dielectric region and a low polarity crystalline region is provided. In accordance with an embodiment of the present invention, it is desirable to deposit an epitaxial carbon-doped silicon film on the low polarity crystalline region, but not on a high polarity dielectric region. Thus, in one embodiment, a series of deposition/etch steps is used.

Referring to step 404 of flowchart 400, a precursor gas mixture for depositing an epitaxial carbon-doped silicon layer is flowed above the substrate provided in step 402. In accordance with an embodiment of the present invention, the precursor gas mixture deposits a silyl surface, i.e. Si—H moieties, above the high polarity dielectric region while depositing a carbon-doped silicon layer above the low polarity crystalline region of the substrate. That is, in one embodiment, acetylene molecules do not adsorb onto the high polarity dielectric region of the substrate.

The precursor gas mixture from step 404 may comprise a volume of a silicon precursor gas, a volume of acetylene gas and a volume of carrier gas. The ratio of the precursor gases in the gas mixture may be any ratio that provides a carbon-doped silicon film having a desired amount of substitutional carbon atoms. In one embodiment, the volume of the silicon precursor gas, the volume of the acetylene gas and the volume of the carrier gas are present in a ratio of approximately 1000:1:1000000. The temperature of the precursor gas mixture may be in a range sufficient to provide a carbon-doped silicon film having a desired amount of substitutional carbon atoms and a negligible amount of residual hydrogen atoms. In one embodiment, the temperature of the gas mixture is in a range sufficient to desorb the majority of hydrogen atoms of the acetylene molecules without desorbing the carbon atoms of the acetylene molecules once bonded to the low polarity crystalline region of the substrate. In a specific embodiment, the temperature of the gas mixture is in the range of 500-800° C. The pressure of a deposition chamber housing the precursor gas mixture and the substrate may be sufficiently low to maintain a controlled deposition rate of the carbon-doped silicon film. In one embodiment, the pressure of the gas mixture in the deposition chamber is less than 200 Torr. The silicon precursor gas may be any gas suitable to provide a clean source of silicon atoms. In one embodiment, the silicon precursor gas is silane. The carrier gas may be any gas suitable to aid in the delivery of the gas mixture to the substrate surface without interfering with the deposition process. In one embodiment, the carrier gas is hydrogen.

Referring to step 406 of flowchart 400, the flow of the precursor gas mixture is stopped and the silyl surface from the high polarity dielectric region is removed. The silyl surface may be removed by any method suitable to re-expose the surface of the high polarity dielectric region without impacting the carbon-doped silicon layer deposited on the low polarity crystalline region. In one embodiment, the silyl surface above the high polarity dielectric region is removed by flowing hydrogen chloride gas (HCl) as an etchant above the substrate. In a specific embodiment, the HCl gas is delivered with hydrogen as a carrier gas. In a particular embodiment, a hydrogen gas purge step is subsequently carried out to remove any residual HCl gas from above the substrate.

Referring to step 408 of flowchart 400, the steps 404 and 406 of flowing the precursor gas mixture and removing the silyl surface are repeated a sufficient number of times to provide an epitaxial carbon-doped silicon film having a desired thickness above the low polarity crystalline surface of the substrate, as represented by step 410 of flowchart 400. In one embodiment, step 404 is carried out for a duration of approximately 10 seconds, step 406 is carried out for a duration of approximately 10 seconds and a hydrogen purge step is carried out for a duration of approximately 1 minute. In a specific embodiment, the cycle 408 consisting of flowing the precursor gas mixture, flowing the HCl etchant and purging with hydrogen is repeated approximately 15 times to provide an epitaxial carbon-doped silicon film having a thickness in the range of 500-3000 Angstroms above the low polarity crystalline region and to leave the surface of the high polarity dielectric region exposed. In one embodiment, the epitaxial carbon-doped silicon film has an atomic concentration of substitutional carbon atoms greater than 1.5% of the total composition of the film.

Figure 5:
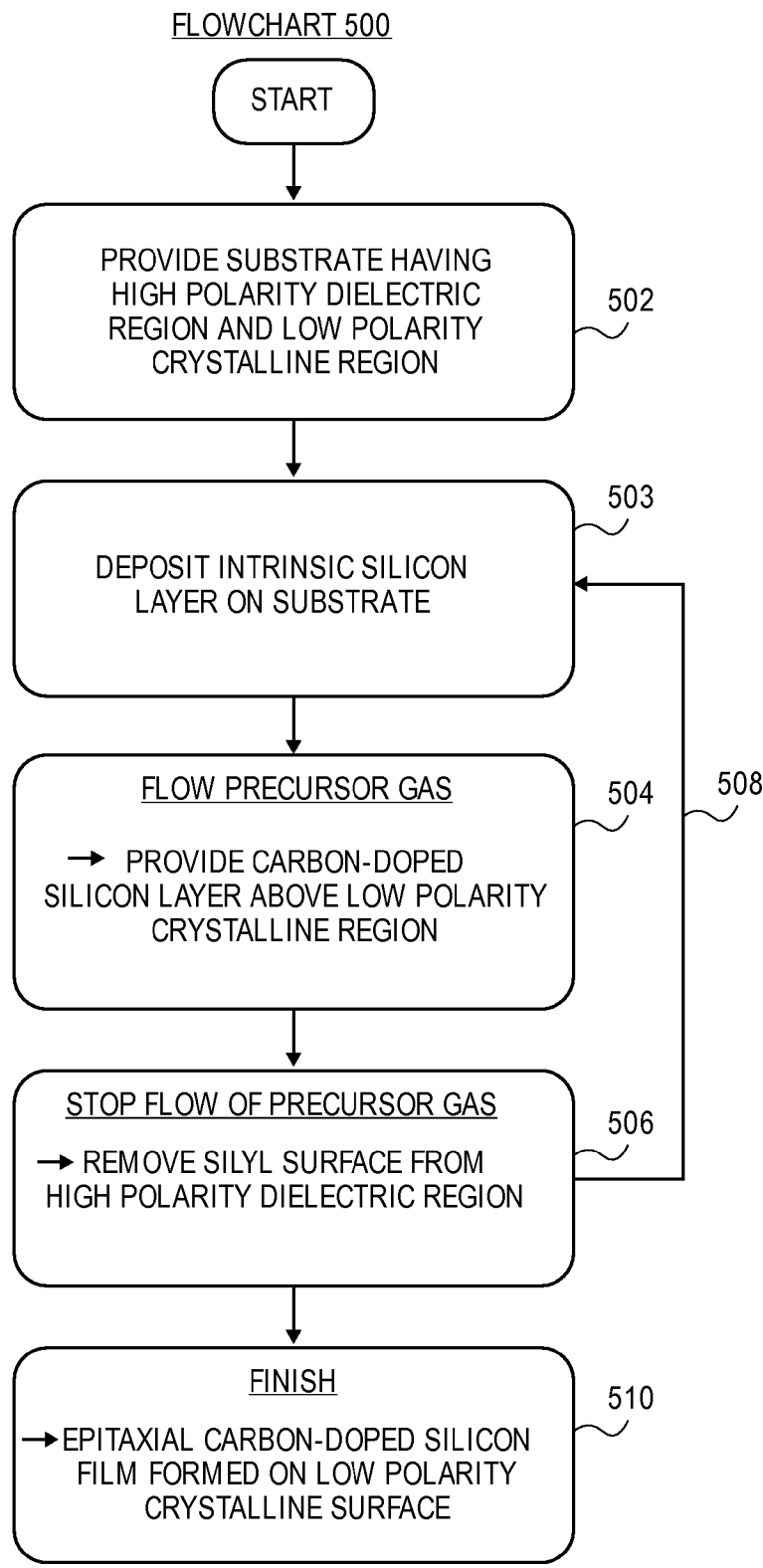
FIG. 5 is a flowchart representing the steps in the deposition process of an epitaxial carbon-doped silicon film, in accordance with an embodiment of the present invention.

A precursor gas comprised of acetylene molecules may be used to deposit an epitaxial carbon-doped silicon film in two distinct deposition steps. FIG. 5 is a flowchart representing the steps in the deposition process of an epitaxial carbon-doped silicon film, in accordance with an embodiment of the present invention.

Referring to step 502 of flowchart 500, a substrate having a high polarity dielectric region and a low polarity crystalline region is provided. In accordance with an embodiment of the present invention, it is desirable to deposit an epitaxial carbon-doped silicon film on the low polarity crystalline region, but not on a high polarity dielectric region. Thus, in one embodiment, a series of deposition/etch steps is used.

Referring to step 503 of flowchart 500, a silicon precursor gas for depositing an intrinsic silicon layer is flowed above the substrate provided in step 502. In accordance with an embodiment of the present invention, the silicon precursor gas deposits a silyl surface, i.e. Si—H moieties, above both the high polarity dielectric region and the low polarity crystalline region of the substrate. The silicon precursor gas may be any gas suitable to provide a clean source of silicon atoms. In one embodiment, the silicon precursor gas is silane. A carrier gas may be used to aid in the delivery of the silicon gas mixture to the substrate surface without interfering with the deposition process. In one embodiment, the carrier gas is hydrogen. In a specific embodiment, depositing the intrinsic silicon layer comprises flowing silane and hydrogen in an approximate ratio of 1:200 for approximately 10 seconds.

Referring to step 504 of flowchart 500, an acetylene precursor gas mixture is flowed above the silyl surface provided in step 503. In accordance with an embodiment of the present invention, the acetylene precursor gas mixture enables the absorption of carbon atoms above the low polarity crystalline region of the substrate, but not above the high polarity dielectric region. That is, in one embodiment, acetylene molecules do not adsorb onto the silyl surface of the high polarity dielectric region of the substrate.

The acetylene precursor gas mixture from step 504 may comprise a volume of acetylene gas and a volume of carrier gas. The ratio of the precursor gases in the acetylene gas mixture may be any ratio that provides a desired amount of substitutional carbon atoms. In one embodiment, the volume of the acetylene gas and the volume of the carrier gas are present in a ratio of approximately 1:500000. The temperature of the acetylene precursor gas mixture may be in a range sufficient to provide a carbon-doped silicon layer having a desired amount of substitutional carbon atoms and a negligible amount of residual hydrogen atoms. In one embodiment, the temperature of the acetylene gas mixture is in a range sufficient to desorb the majority of hydrogen atoms of the acetylene molecules without desorbing the carbon atoms of the acetylene molecules once bonded to the silyl surface of the low polarity crystalline region of the substrate. In a specific embodiment, the temperature of the acetylene gas mixture is in the range of 500-800° C. The pressure of a deposition chamber housing the acetylene gas mixture and the substrate may be sufficiently low to maintain a controlled adsorption rate of the carbon atoms. In one embodiment, the pressure of the acetylene gas mixture in the deposition chamber is less than 200 Torr. The carrier gas may be any gas suitable to aid in the delivery of the acetylene gas mixture to the substrate surface without interfering with the deposition process. In one embodiment, the carrier gas is hydrogen.

Referring to step 506 of flowchart 500, the flow of the acetylene precursor gas mixture is stopped and the silyl surface from the high polarity dielectric region is removed. The silyl surface may be removed by any method suitable to re-expose the surface of the high polarity dielectric region without impacting the carbon-doped silicon layer deposited on the low polarity crystalline region. In one embodiment, the silyl surface above the high polarity dielectric region is removed by flowing hydrogen chloride gas (HCl) as an etchant above the substrate. In a specific embodiment, the HCl gas is delivered with hydrogen as a carrier gas. In a particular embodiment, a hydrogen gas purge step is subsequently carried out to remove any residual HCl gas from above the substrate.

Referring to step 508 of flowchart 500, the steps 503, 504 and 506 of flowing the silicon precursor gas mixture, flowing the acetylene gas mixture and removing the silyl surface are repeated a sufficient number of times to provide an epitaxial carbon-doped silicon film having a desired thickness above the low polarity crystalline surface of the substrate, as represented by step 510 of flowchart 500. In one embodiment, step 503 is carried out for a duration of approximately 10 seconds, step 504 is carried out for a duration of approximately 2 seconds, step 506 is carried out for a duration of approximately 10 seconds and a hydrogen purge step is carried out for a duration of approximately 1 minute. In a specific embodiment, the cycle 508 is repeated approximately 25 times to provide an epitaxial carbon-doped silicon film having a thickness in the range of 500-3000 Angstroms above the low polarity crystalline region and to leave the surface of the high polarity dielectric region exposed. In one embodiment, the epitaxial carbon-doped silicon film has an atomic concentration of substitutional carbon atoms greater than 1.5% of the total composition of the film.

Figure 6:
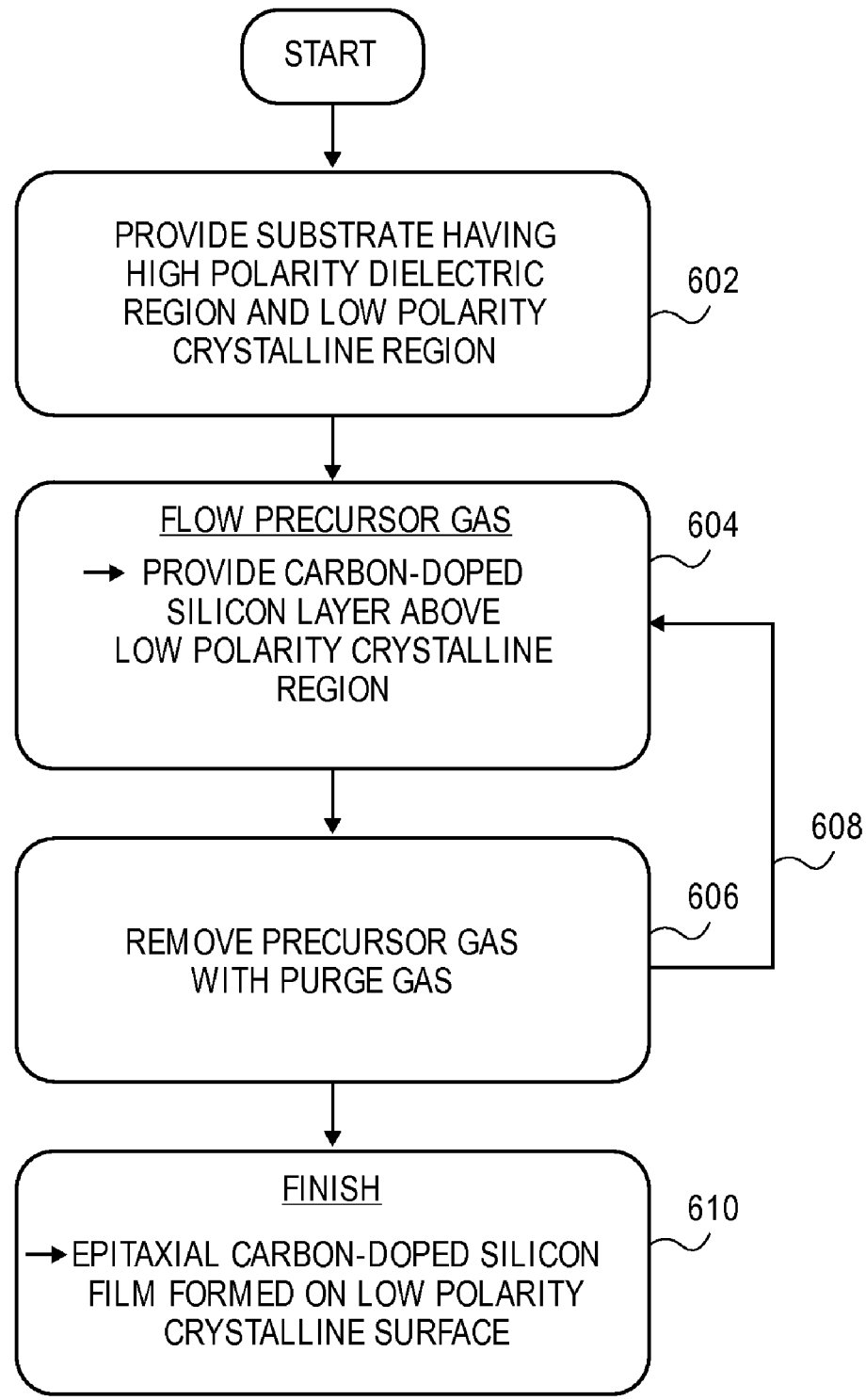
FIG. 6 is a flowchart representing the steps in the deposition process of an epitaxial carbon-doped silicon film, in accordance with an embodiment of the present invention.

A precursor gas comprised of acetylene molecules having an in situ etchant gas may be used to deposit an epitaxial carbon-doped silicon film. FIG. 6 is a flowchart representing the steps in the deposition process of an epitaxial carbon-doped silicon film, in accordance with an embodiment of the present invention.

Referring to step 602 of flowchart 600, a substrate having a high polarity dielectric region and a low polarity crystalline region is provided. In accordance with an embodiment of the present invention, it is desirable to deposit an epitaxial carbon-doped silicon film on the low polarity crystalline region, but not on a high polarity dielectric region. Thus, in one embodiment, an in situ deposition/etch method is used.

Referring to step 604 of flowchart 600, a precursor gas mixture is flowed above the substrate provided in step 602. In accordance with an embodiment of the present invention, the precursor gas mixture enables the deposition of a carbon-doped silicon layer above the low polarity crystalline region of the substrate, but not above the high polarity dielectric region.

The precursor gas mixture from step 604 may comprise a volume of acetylene gas, a volume of a silicon precursor gas, a volume of an etchant gas and a volume of carrier gas. The ratio of the precursor gases in the mixture may be any ratio that provides an epitaxial carbon-doped silicon film having a desired amount of substitutional carbon atoms. In one embodiment, the volume of the acetylene gas, the volume of the silicon precursor gas, the volume of the etchant gas and the volume of the carrier gas are present in a ratio of approximately 1:500:500:300000. In one embodiment, the silicon precursor gas deposits an intrinsic silicon layer above the low polarity crystalline region and a silyl surface above the high polarity dielectric region, while the acetylene precursor gas adsorbs only to the low polarity crystalline region. The etchant gas removes the silyl surface from the high polarity dielectric region without impacting the acetylene molecules adsorbed to the intrinsic silicon surface formed on the low polarity crystalline region.

The temperature of the precursor gas mixture may be in a range sufficient to provide a carbon-doped silicon layer having a desired amount of substitutional carbon atoms and to enable the etchant gas to remove the silyl surface from the high polarity dielectric region. In one embodiment, the temperature of the gas mixture is in a range sufficient to desorb the majority of hydrogen atoms of the acetylene molecules without desorbing the carbon atoms of the acetylene molecules once bonded to the intrinsic silicon surface of the low polarity crystalline region of the substrate. In a specific embodiment, the temperature of the gas mixture is in the range of 500-800° C. The pressure of a deposition chamber housing the precursor gas mixture and the substrate may be sufficiently low to maintain a controlled deposition rate of the carbon-doped silicon layer above the low polarity crystalline region of the substrate and to maintain a controlled etch rate of the silyl surface from the high polarity dielectric region of the substrate. In one embodiment, the pressure of the precursor gas mixture in the deposition chamber is less than 200 Torr. The carrier gas may be any gas suitable to aid in the delivery of the acetylene gas mixture to the substrate surface without interfering with the deposition process. In one embodiment, the carrier gas is hydrogen. The silicon precursor gas may be any gas suitable to provide a clean source of silicon atoms. In one embodiment, the silicon precursor gas is selected from the group consisting of silane and dichlorosilane. The etchant gas may be any suitable species sufficient to re-expose the surface of the high polarity dielectric region without impacting the carbon-doped silicon layer deposited on the low polarity crystalline region. In one embodiment, the etchant gas is selected from the group consisting of hydrogen chloride, hydrogen bromide, and chlorine.

Referring to step 606 of flowchart 600, the flow of the precursor gas mixture is stopped and a purge gas is flowed in order to remove deposition and etch by-products from a single deposition/etch step. In a particular embodiment, the purge gas is hydrogen. Referring to step 608 of flowchart 600, the steps 604 and 606 of flowing the precursor gas mixture and purging with a purge gas are repeated a sufficient number of times to provide an epitaxial carbon-doped silicon film having a desired thickness above the low polarity crystalline surface of the substrate, as represented by step 610 of flowchart 600. In one embodiment, step 604 is carried out for a duration of approximately 2 minutes and step 606 is carried out for a duration of approximately 1 minute. In a specific embodiment, the cycle 608 is repeated approximately 25 times to provide an epitaxial carbon-doped silicon film having a thickness in the range of 500-2000 Angstroms above the low polarity crystalline region and to leave the surface of the high polarity dielectric region exposed. In one embodiment, the epitaxial carbon-doped silicon film has an atomic concentration of substitutional carbon atoms greater than 1.5% of the total composition of the film.

Any of the deposition sequences illustrated in flowcharts 400, 500 and 600 may be used to selectively form an epitaxial carbon-doped silicon film in an etched-out region of a crystalline lattice. FIGS. 7A-G illustrate cross-sectional views representing the formation of an epitaxial film in an etched-out region of a crystalline substrate, in accordance with an embodiment of the present invention.

Figure 7A:
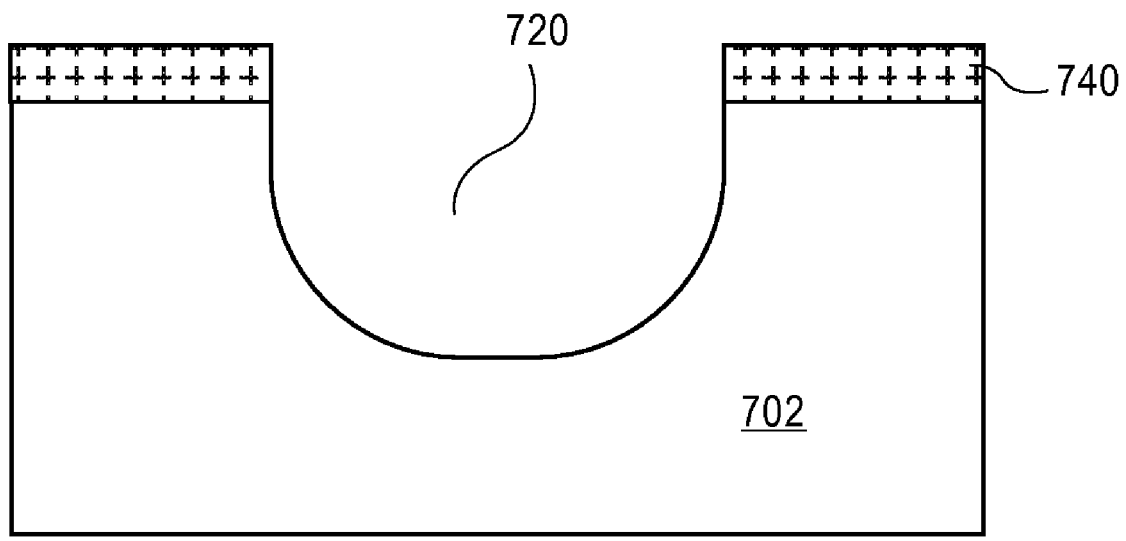
FIGS. 7A-G illustrate cross-sectional views representing the formation of an epitaxial film in an etched-out region of a crystalline substrate, in accordance with an embodiment of the present invention.

Referring to FIG. 7A, a region of low polarity crystalline substrate 702 between highly polar dielectric regions 740 may be removed to form etched-out region 720. Low polarity crystalline substrate 702 may be formed from any material that provides a low polarity surface on its top surface and/or on the surface of an etched-out portion of the substrate. In one embodiment, crystalline substrate 702 is a crystalline silicon substrate, a doped crystalline silicon substrate, or an epitaxial silicon layer grown atop a distinct boron-doped crystalline silicon substrate. In another embodiment, crystalline substrate 702 is comprised of germanium or a III-V material such as but not limited to gallium nitride, gallium phosphide, gallium arsenide, indium phosphide or indium antimonide. The bottom surface of etched-out region 720 may be a low polarity surface. A low polarity surface comprises atomic interactions of substantially similar polarity. In accordance with an embodiment of the present invention, the deposition of a low polarity film, such as a film of carbon-doped silicon, is more favored on low polarity surfaces versus high polarity surfaces. For example, in one embodiment, as calculated using the difference of Pauling's values for electronegativity for each atom type (N. N. Greenwood and A. Earnshaw, *Chemistry of the Elements*, $2^{nd}$ Ed., Reed Educational and Professional Publishing Ltd, 1997, p. 26), the atomic interactions of a carbon-doped silicon film have a difference of Pauling's values of less than 1 (for example: where Si is ~1.8 and C is ~2.5, an Si—C bond has a value of ~0.7).

The highly polar dielectric region 740 comprises atomic interactions of substantially different polarity. For example, the highly polar dielectric region 740 may be comprised of any dielectric material where the surface atomic interactions have a difference of Pauling's values greater than 1. In one embodiment, highly polar dielectric region 740 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride, carbon-doped silicon oxide or nitride, or a high-K dielectric layer.

Etched-out region 720 may be formed by any suitable technique that removes a portion of substrate 702 without significantly impacting high polarity dielectric regions 740. In one embodiment, etched out region 720 is formed by first masking crystalline substrate 702 with a masking layer and then etching any exposed portions of crystalline substrate 702 with a dry etch or wet etch process. In an embodiment, etched out region 720 is formed by a dry plasma etch using $NF_3$, HBr, $SF_6$/Cl or $Cl_2$ or a wet etch using $NH_4OH$ or tetramethylammonium hydroxide. In another embodiment, etched-out region 720 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes.

Referring to FIGS. 7B-F, an epitaxial carbon-doped silicon film 708 may be formed in etched-out region 720 of crystalline substrate 702. A pre-treatment of the low polarity surface may be required prior to the possible deposition processes described below. For example, in accordance with an embodiment of the present invention, a fresh surface of the etched-out portion 720 of substrate 702 is prepared by removing any native oxide layers prior to the deposition process. In one embodiment, the surface of etched-out region 720 of substrate 702 is subjected to a wet clean step comprising aqueous hydrofluoric acid with a concentration in the range of 0.2-2% by volume for a duration in the range of 15 s-2 minutes at a temperature in the range of 10-50 degrees Celsius.

Figure 7B:
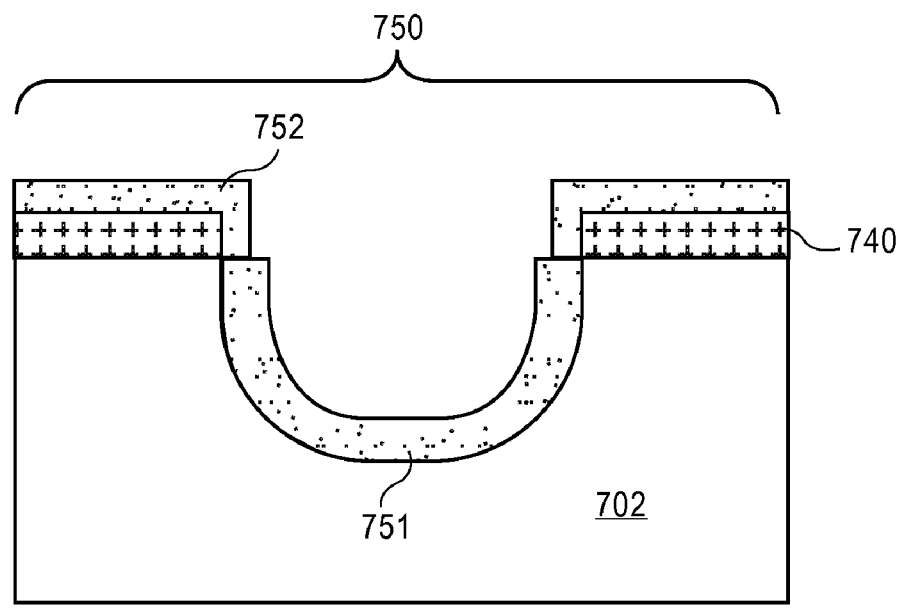
Figure 7C:
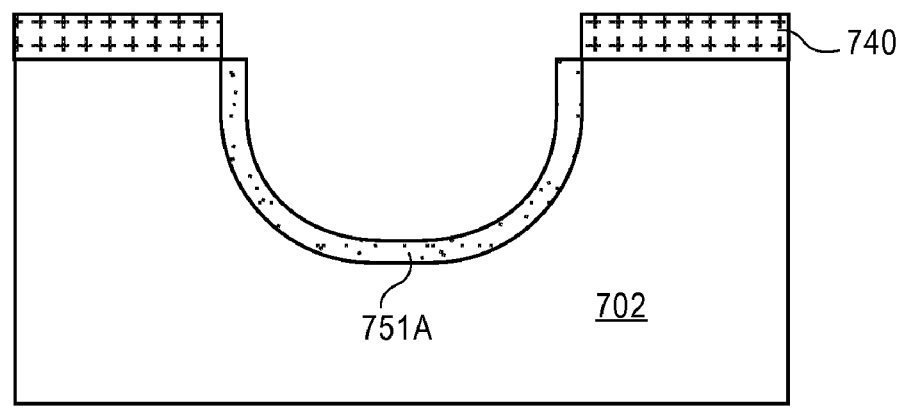
Figure 7D:
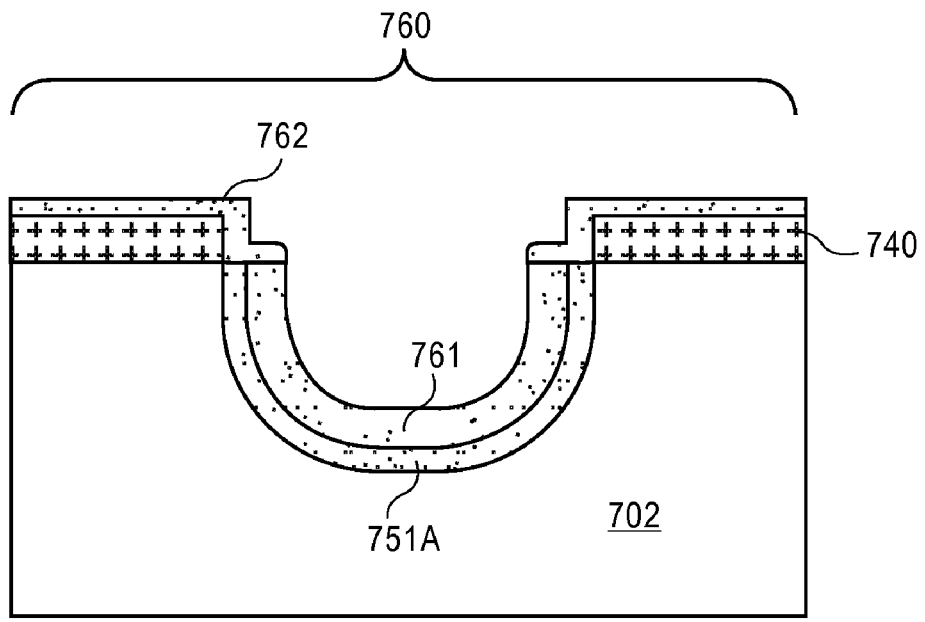
Figure 7E:
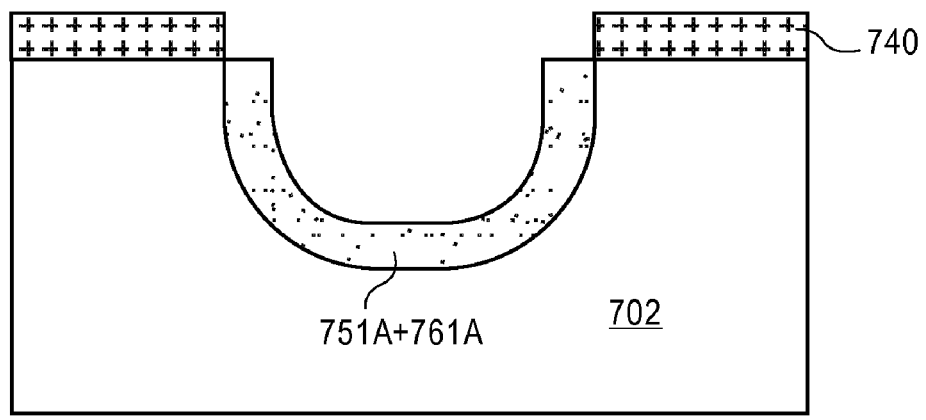
Figure 7F:
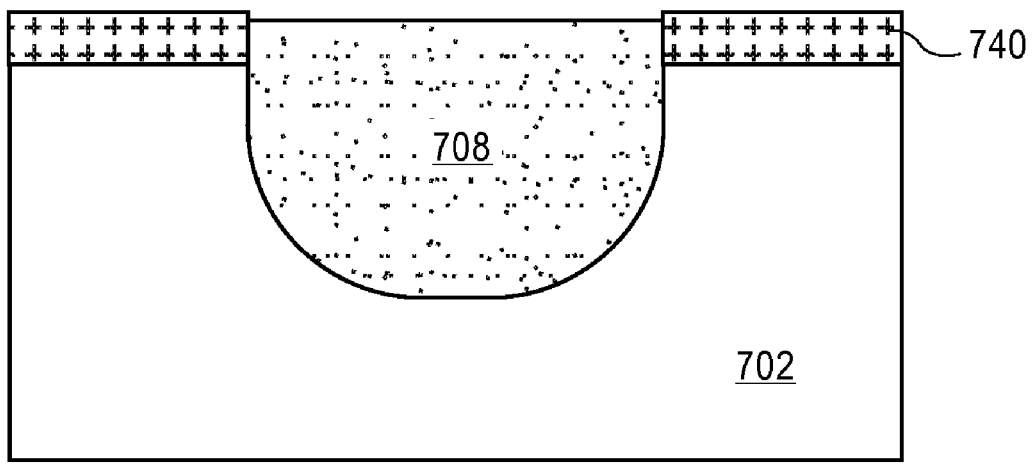

A deposition process may be used involving multiple cycles of flowing a precursor gas mixture, flowing and etchant gas and purging with the etchant gas to provide an epitaxial carbon-doped silicon film. Thus, in accordance with an embodiment of the present invention, a deposition process such as the one described in association with flowchart 400 is used to form epitaxial carbon-doped silicon film 708. Referring to FIG. 7B, a deposition layer 750 is formed on highly polar dielectric regions 740 and in etched-out region 720. The portion of deposition layer 750 formed on the low polarity surface of etched-out region 720 is an epitaxial carbon-doped silicon layer 751, while the portion of deposition layer 750 formed on the highly polar dielectric regions 740 is a silyl layer 752 (cf. step 404 of flowchart 400). Referring to FIG. 7C, the silyl layer 752 is removed to expose the surface of highly polar dielectric regions 740 (cf. step 406 of flowchart 400). In one embodiment, a portion of epitaxial carbon-doped silicon layer 751 is also inadvertently removed to form a thinner epitaxial carbon-doped silicon layer 751A, as depicted in FIG. 7C. In an alternative embodiment, none of the epitaxial carbon-doped silicon layer 751 is removed. Referring to FIG. 7D, a second deposition layer 760 is formed on highly polar dielectric regions 740 and on epitaxial carbon-doped silicon layer 751A (cf. step 408 of flowchart 400). The portion of second deposition layer 760 formed on epitaxial carbon-doped silicon layer 751A is an epitaxial carbon-doped silicon layer 761, while the portion of second deposition layer 760 formed on the highly polar dielectric regions 740 is a silyl layer 762. Referring to FIG. 7E, a second removal step is carried out to provide an iteratively thicker epitaxial carbon-doped silicon film (751A+761A) in etched-out region 720 of substrate 702. Referring to FIG. 7F, an epitaxial carbon-doped silicon film 708 is thus provided on the low-polarity crystalline surface of substrate 702 but not on the highly polar dielectric regions 740.

Figure 7G:
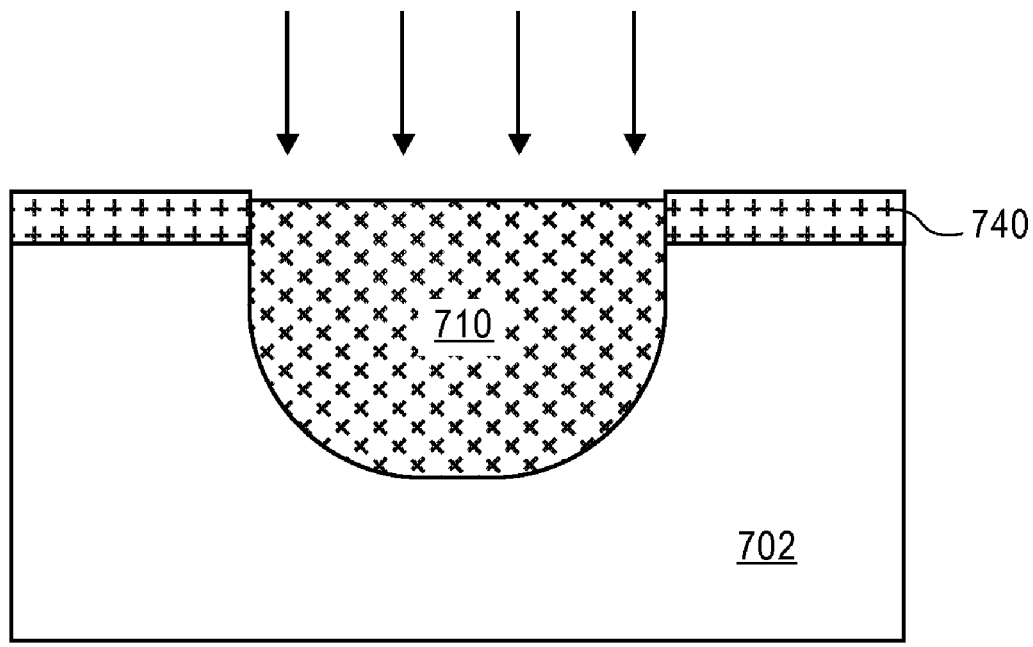

Referring to FIG. 7G, charge-carrier dopant impurity atoms may subsequently be implanted into epitaxial carbon-doped silicon film 708 to form doped epitaxial carbon-doped silicon film 710. In one embodiment, the charge-carrier dopant impurity atoms are phosphorus, arsenic, boron or indium atoms. In an embodiment, phosphorus dopant impurity atoms are implanted at a dose in the range of 3E15-1E16 atoms/cm$^2$ with an energy in the range of 3-20 keV. Doped epitaxial carbon-doped silicon film 710 may then be heated to substitutionally incorporate the dopant impurity atoms into its crystalline lattice. In one embodiment, doped epitaxial carbon-doped silicon film 710 is heated to a temperature in the range of 1000° C.-1300° C. for a duration of 10 microseconds-10 milliseconds.

An epitaxial carbon-doped silicon film may be formed in etched-out regions of a MOS-FET. FIGS. 8A-D illustrate cross-sectional views representing the formation of strain-inducing source/drain regions in an NMOS-FET, in accordance with an embodiment of the present invention.

Figure 8A:
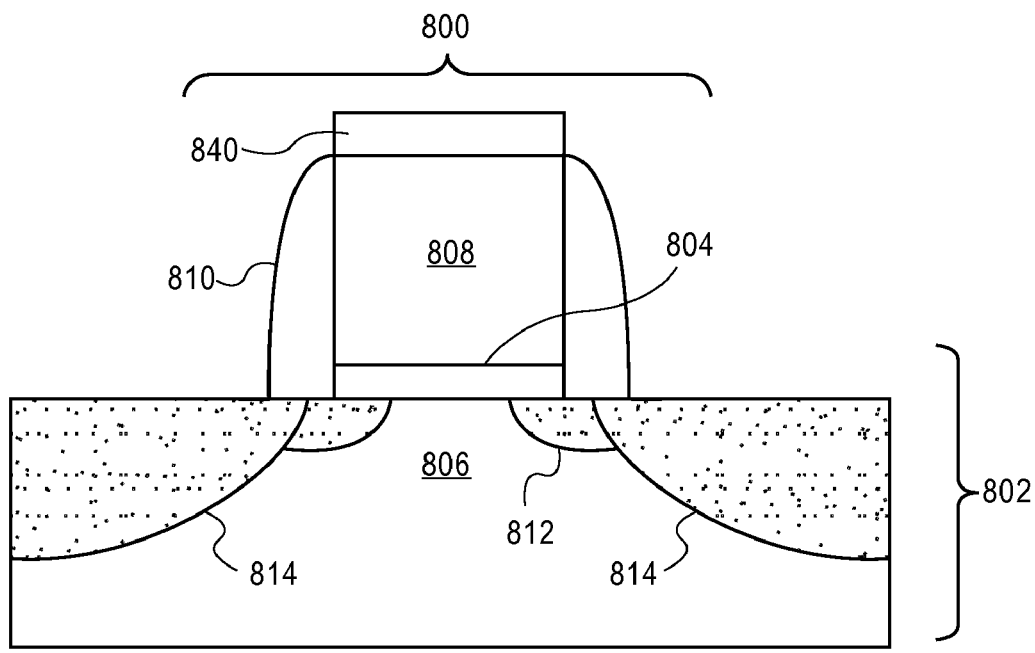
FIGS. 8A-D illustrate cross-sectional views representing the formation of strain-inducing source/drain regions in an NMOS-FET, in accordance with an embodiment of the present invention.

Referring to FIG. 8A, a non-strained NMOS-FET 800 is first formed. Non-strained NMOS-FET 800 is comprised of a channel region 806 in a crystalline substrate 802. Crystalline substrate 802 may be any substrate described in association with substrate 702 from FIG. 7A.

A gate dielectric layer 804 may be formed above channel region 806. In one embodiment, gate dielectric layer 804 is formed by a thermal oxidation process and is comprised of silicon dioxide or silicon oxy-nitride. In another embodiment, gate dielectric layer 804 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 808 may be formed above gate dielectric layer 804. Gate electrode 808 may be formed by a subtractive etching process scheme or by a replacement gate process scheme. In one embodiment, gate electrode 808 is comprised of a polycrystalline silicon gate electrode, wherein the charge-carrier dopant impurities are implanted during fabrication of the tip and source/drain regions, described below. In another embodiment, gate electrode 808 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide.

A highly polar dielectric gate electrode protection layer 840 is formed above gate electrode 808, as depicted in FIG. 5A. The highly polar dielectric gate electrode protection layer 840 may be formed from any material suitable to provide a highly polar dielectric surface. In an embodiment, highly polar dielectric gate electrode protection layer 840 is comprised of a dielectric material with surface atomic interactions having a difference of Pauling's values greater than 1. In one embodiment, highly polar dielectric gate electrode protection layer 840 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride or carbon-doped silicon nitride.

A tip extension 812 may be formed by implanting charge-carrier dopant impurity atoms into substrate 802. Gate electrode 808 may act to mask a portion of substrate 802 to form self-aligned tip extensions 812. In one embodiment, boron, arsenic, phosphorus, indium or a combination thereof is implanted into substrate 802 to form tip extension 812.

Gate dielectric layer 804 and gate electrode 808 may be isolated by a pair of highly polar dielectric gate isolation spacers 810. The pair of highly polar dielectric gate isolation spacers 810 may be formed from any material suitable to provide a highly polar dielectric surface. In an embodiment, the pair of highly polar dielectric gate isolation spacers 810 is comprised of any material described in association with highly polar dielectric gate electrode protection layer 840. In another embodiment, the thickness of the highly polar dielectric layer is selected to determine the final width of the pair of highly polar dielectric gate isolation spacers 810. In one embodiment, the pair of highly polar dielectric gate isolation spacers 810 forms a hermetic seal with gate electrode 808 and the top surface of substrate 802 in order to encapsulate gate dielectric layer 804.

A sacrificial source/drain region 814 may be formed, but is not required, by implanting charge-carrier dopant impurity atoms into substrate 802. Thus, source/drain region 814 may be formed from the same material as channel region 806. Therefore, the lattice mismatch between source/drain region 814 and channel region 806 may be negligible, resulting in effectively no strain induced on channel region 806. The pair of highly polar dielectric gate isolation spacers 810 and gate electrode 808 may act to shield a portion of substrate 802 during the implant step to form self-aligned sacrificial source/drain regions 814. In effect, the thickness of the pair of highly polar dielectric gate isolation spacers 810 may play a role in dictating the dimensions of sacrificial source/drain region 814. In one embodiment, boron, arsenic, phosphorus, indium or a combination thereof is implanted into substrate 802 to form sacrificial source/drain regions 814.

Figure 8B:
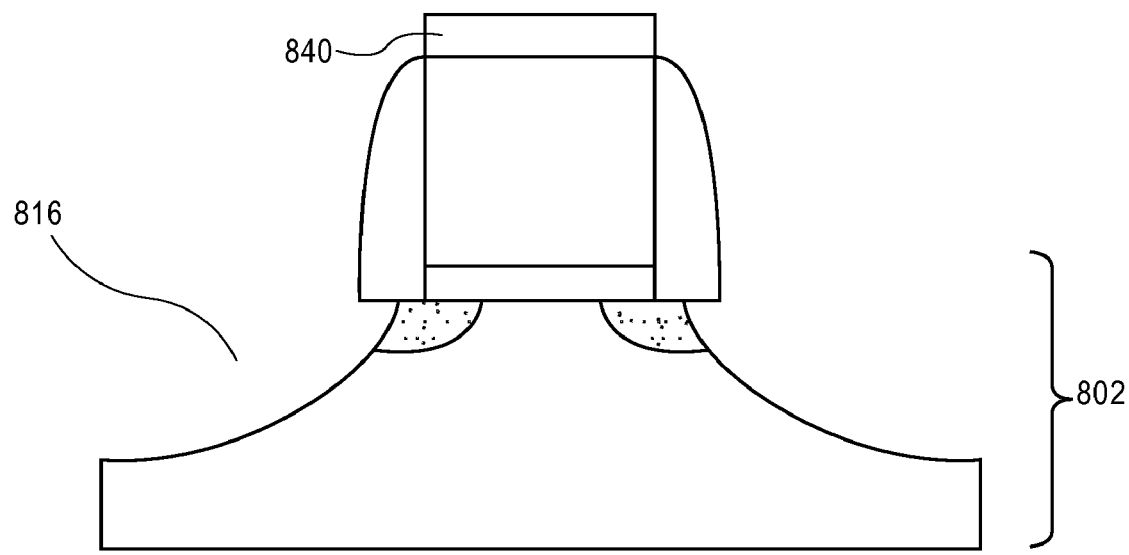

Referring to FIG. 8B, portions of substrate 802, including source/drain regions 814, may be removed to form recessed region 816 in substrate 802. Recessed region 816 may be formed by any suitable technique that removes a portion of substrate 802 without detrimentally impacting other semiconductor features that are present, such as a dry etch or a wet etch process. In one embodiment, recessed region 816 is formed by a dry plasma etch using $NF_3$, HBr, $SF_6$/Cl or $Cl_2$ or a wet etch using $NH_4OH$ or tetramethylammonium hydroxide. In another embodiment, recessed region 816 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes. In one embodiment, highly polar dielectric gate electrode protection layer 840 protects gate electrode 808 during the formation of recessed region 816. In another embodiment, recessed region 816 is formed to a depth sufficient to remove the charge-carrier dopant impurity atoms implanted to form sacrificial source/drain region 814, as depicted in FIG. 8B. In one embodiment, recessed region 816 is laterally recessed to further remove a substantial portion of tip extension 812.

Figure 8C:
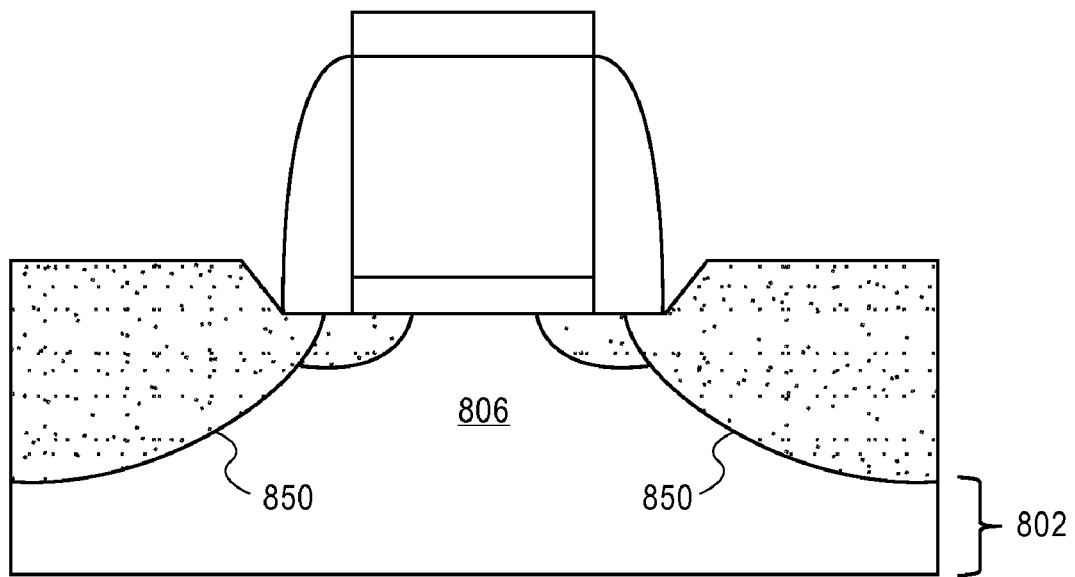

Referring to FIG. 8C, epitaxial carbon-doped silicon film 850 is formed selectively in recessed region 816. Epitaxial carbon-doped silicon film 850 may be deposited by any suitable selective deposition technique that enables formation on low polarity crystalline substrate 802 but not on highly polar dielectric gate electrode protection layer 840 or the pair of highly polar dielectric gate isolation spacers 810. In accordance with an embodiment of the present invention, epitaxial carbon-doped silicon film 850 is selectively formed by using one of the deposition techniques described in association with flowcharts 400, 500 and 600. In a specific embodiment, the top surface of epitaxial carbon-doped silicon film 850 is raised above the top surface of substrate 802, and hence above the top surface of channel region 806, as depicted in FIG. 8C.

Figure 8D:
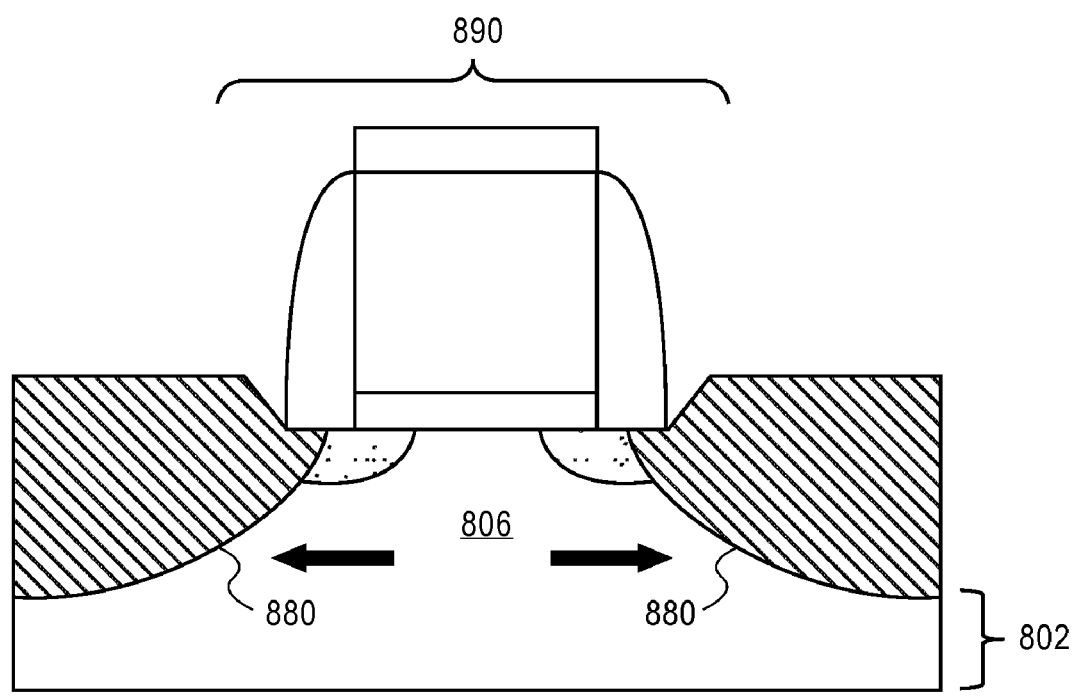

Referring to FIG. 8D, dopant impurity atoms are incorporated into epitaxial carbon-doped silicon film 850 to form impurity-doped epitaxial carbon-doped silicon film 880. In one embodiment, impurity-doped epitaxial carbon-doped silicon film 880 has a lattice constant smaller than the lattice constant of substrate 802, and hence channel region 806, and induces a tensile strain on channel region 806. In one embodiment, impurity-doped epitaxial carbon-doped silicon film 880 is comprised of greater than 1.5% lattice-substitutional carbon atoms and phosphorus charge-carrier dopant impurity atoms with a concentration greater than $2E20$ atoms/cm$^3$. Impurity-doped epitaxial carbon-doped silicon film 880 may function as a source/drain region and thus NMOS-FET 890 may comprise strain-inducing source/drain regions. Therefore, a uniaxial tensile strain, depicted by the arrows in FIG. 8D, may be imparted to channel region 806, which can enhance electron mobility in the device. NMOS-FET 890 may subsequently be incorporated into an integrated circuit by conventional process steps, as known in the art.

Figure 9A:
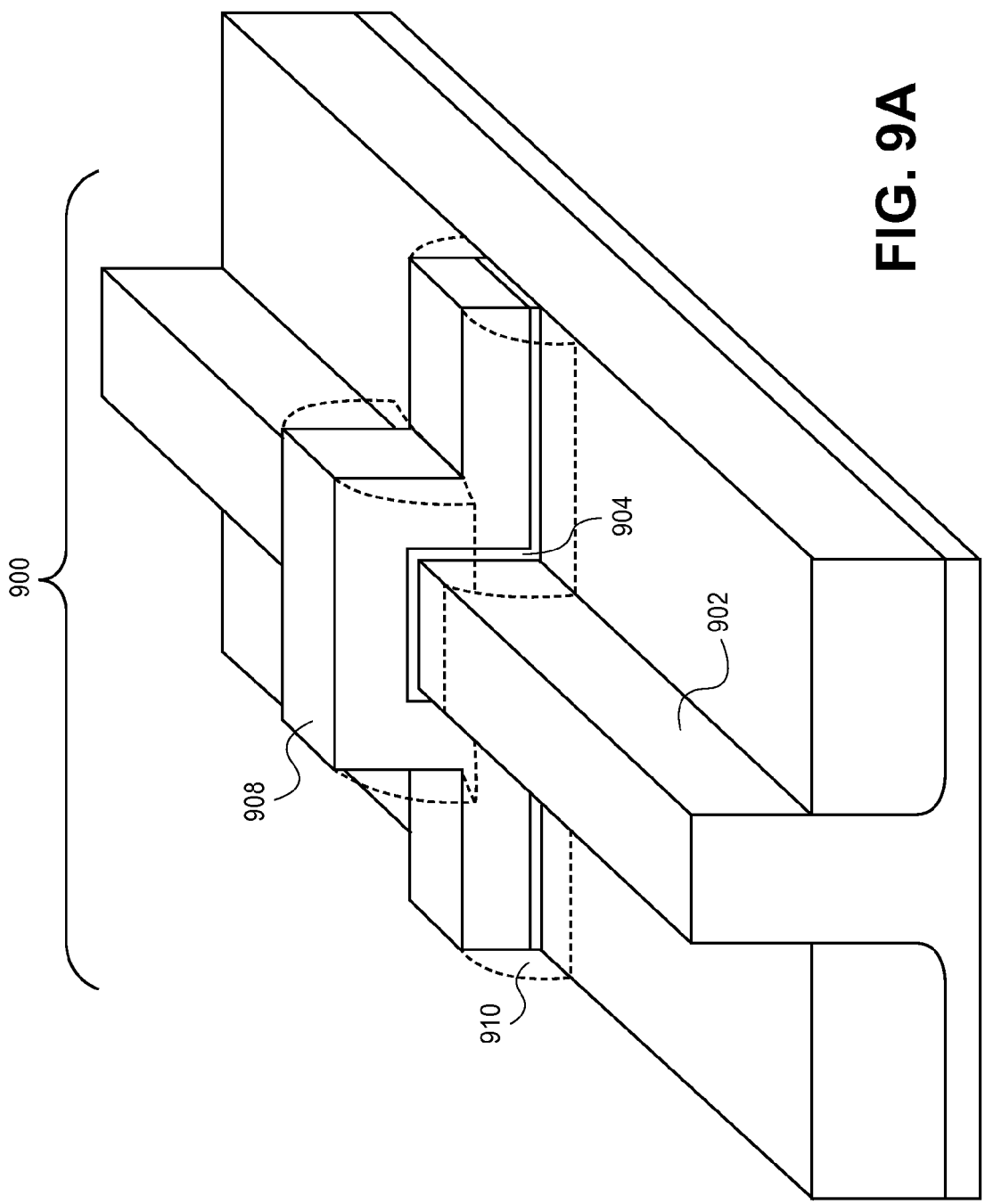
Figure 9C:
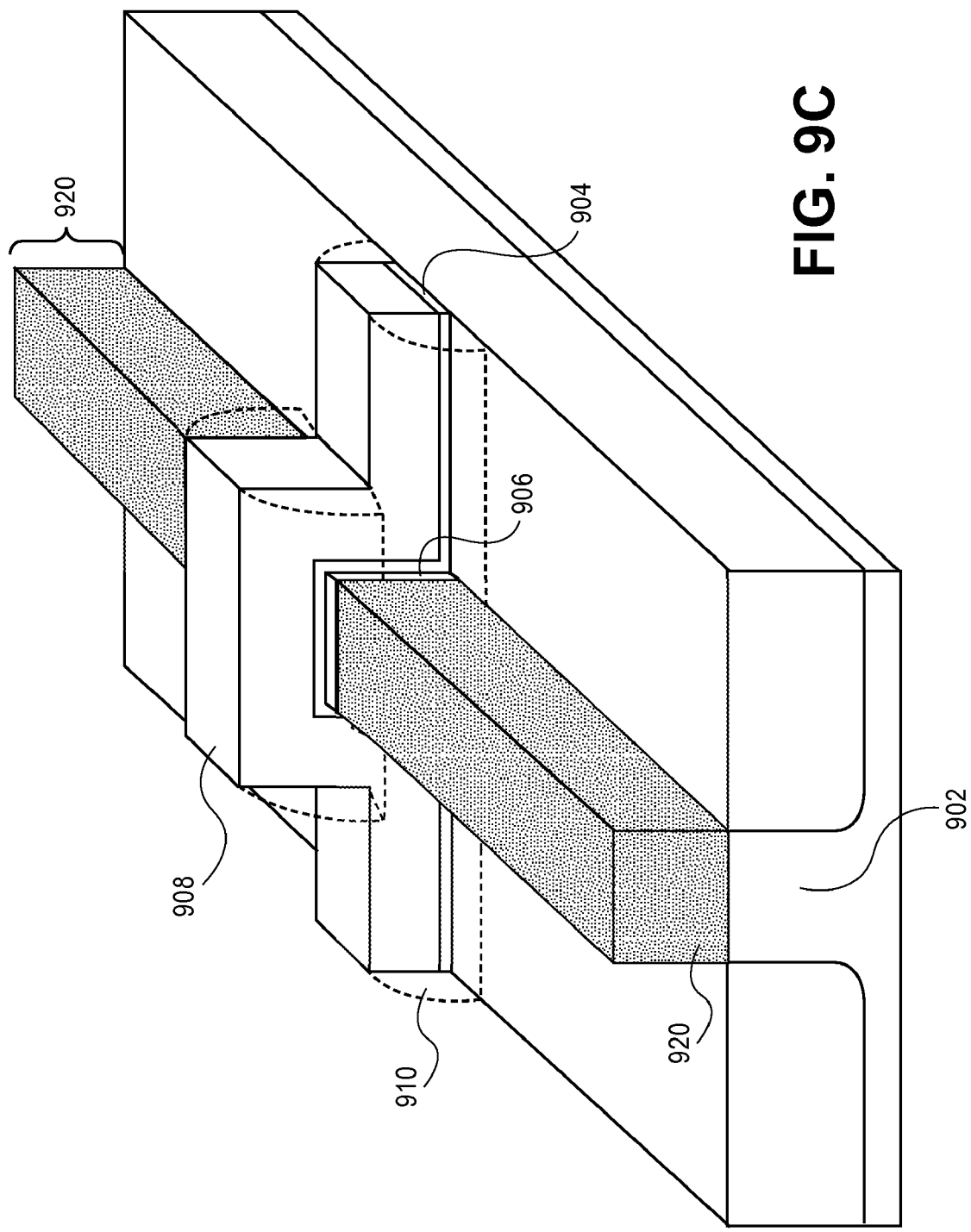

The present invention is not limited to the formation of planar MOS-FETs comprising an epitaxial carbon-doped silicon film. For example, devices with a three-dimensional architecture, such as tri-gate devices, may benefit from the above process. FIGS. 9A-C illustrate cross-sectional views representing the formation of strain-inducing source/drain regions in a non-planar NMOS-FET, in accordance with an embodiment of the present invention.

Referring to FIG. 9A, the foundation of a bulk-substrate tri-gate MOS-FET 900 is formed. Tri-gate MOS-FET 900 is comprised of a three-dimensional substrate 902. Three-dimensional substrate 902 may be formed from any material described in association with substrate 702 from FIG. 7A. A gate dielectric layer 904 is formed around three-dimensional substrate 902 and a gate electrode 908 is formed above gate dielectric layer 904. Gate dielectric layer 904 and gate electrode 908 are protected by a pair of gate isolation spacers 910. Gate dielectric layer 904, gate electrode 908 and gate isolation spacers 910 may be comprised of any material discussed in association with gate dielectric layer 804, gate electrode 808 and gate isolation spacers 810 from FIG. 8A.

Referring to FIG. 9B, portions of three-dimensional substrate 902 are removed, leaving channel region 906. Referring to FIG. 9C, an epitaxial carbon-doped silicon film is used to form epitaxial source/drain regions 920. The epitaxial carbon-doped silicon film may be formed by any technique described in association with flowcharts 400, 500 and 600. Hence, a method to form a tri-gate MOS-FET device comprising strain-inducing source/drain regions has been described. The tri-gate MOS-FET may be incorporated into an integrated circuit by conventional processing steps, as is known in the art.

Thus, a precursor gas mixture for depositing an epitaxial carbon-doped silicon film has been disclosed. In one embodiment, the precursor gas mixture is comprised of a volume of a silicon precursor gas, a volume of acetylene gas and a volume of a carrier gas. A method of forming a semiconductor structure having an epitaxial carbon-doped silicon film has also been disclosed. In one embodiment, a substrate having a high polarity dielectric region and a low polarity crystalline region is provided. A precursor gas is flowed to provide a silyl surface above the high polarity dielectric region and a carbon-doped silicon layer above the low polarity crystalline region. The silyl surface is then removed from above the high polarity dielectric region. The flowing and removing steps are repeated to provide a carbon-doped silicon film of a desired thickness above the low polarity crystalline region.

What is claimed is:

1. A method of forming a semiconductor structure comprising:
   providing a substrate having a high polarity dielectric region and a low polarity crystalline region;
   flowing a precursor gas to provide a carbon-doped silicon layer on said low polarity crystalline region and to provide a silyl surface on said high polarity dielectric region, the silyl surface to completely prevent deposition of the carbon-doped silicon layer on said high polarity dielectric region;
   removing said silyl surface from said high polarity dielectric region; and
   repeating the flowing and removing steps to provide an epitaxial carbon-doped silicon film of a desired thickness on said low polarity crystalline region.

2. The method of claim 1 wherein said precursor gas is comprised of silane, acetylene and hydrogen present in a ratio of approximately 1000:1:1000000, and wherein removing said silyl surface comprises flowing HCl gas above said substrate.

3. The method of claim 1, further comprising:
depositing an intrinsic silicon layer above said substrate prior to each flowing and removing step, wherein removing said silyl surface from said high polarity dielectric region also comprises removing the portion of said intrinsic silicon layer from said high polarity dielectric region.

4. The method of claim 2 wherein flowing said precursor gas is carried out at a temperature in the range of 500-800° C. and a combined pressure of less than 200 Torr.

5. The method of claim 2 wherein flowing said precursor gas is carried out for a duration of approximately 10 seconds, and wherein flowing HCl gas above said substrate is also carried out for a duration of approximately 10 seconds.

6. The method of claim 5 wherein removing said silyl surface further comprises purging the atmosphere above said substrate with hydrogen gas for a duration of approximately 1 minute subsequent to flowing HCl gas above said substrate.

7. The method of claim 3 wherein depositing the intrinsic silicon layer comprises flowing silane and hydrogen in an approximate ratio of 1:200 for approximately 10 seconds.

8. The method of claim 7 wherein said precursor gas is comprised of acetylene and hydrogen present in a ratio of approximately 1:500000, and wherein removing said silyl surface and the portion of said intrinsic silicon layer from said high polarity dielectric region comprises flowing HCl gas above said substrate.

9. A method of forming a semiconductor structure comprising:
providing a substrate having a high polarity dielectric region and a low polarity crystalline region;
flowing a precursor gas to provide a carbon-doped silicon layer above said low polarity crystalline region but not above said high polarity dielectric region, said precursor gas comprising a deposition gas, a carrier gas and an etchant gas, wherein said deposition gas is comprised of acetylene gas and a silicon precursor, wherein said carrier gas is hydrogen, wherein said etchant gas is hydrogen chloride, and wherein said silicon precursor, the acetylene gas, the hydrogen and the hydrogen chloride are present in a ratio of approximately 500:1:300000:500;
removing said precursor gas with a purge gas; and
repeating the flowing and removing steps to provide an epitaxial carbon-doped silicon film of a desired thickness above said low polarity crystalline region.

10. The method of claim 9 wherein said silicon precursor is selected from the group consisting of silane and dichlorosilane.

11. The method of claim 10 wherein flowing said precursor gas is carried out at a temperature in the range of 500-800° C. and a combined pressure of less than 200 Torr.

12. The method of claim 9 wherein flowing said precursor gas is carried out for a duration of approximately 2 minutes, and wherein removing said precursor gas with a purge gas is carried out for a duration of approximately 1 minute.

* * * * *